US006756776B2

(12) United States Patent
Perkinson et al.

(10) Patent No.: US 6,756,776 B2
(45) Date of Patent: Jun. 29, 2004

(54) METHOD AND DEVICE FOR INSTALLING AND REMOVING A CURRENT TRANSFORMER ON AND FROM A CURRENT-CARRYING POWER LINE

(75) Inventors: Joseph C. Perkinson, Boxford, MA (US); Scott D. Brown, Holliston, MA (US)

(73) Assignee: Amperion, Inc., Andover, MA (US)

( * ) Notice: Subject to any disclaimer, the term of this patent is extended or adjusted under 35 U.S.C. 154(b) by 59 days.

(21) Appl. No.: 10/293,729

(22) Filed: Nov. 12, 2002

(65) Prior Publication Data

US 2003/0222747 A1 Dec. 4, 2003

Related U.S. Application Data

(60) Provisional application No. 60/383,833, filed on May 28, 2002.

(51) Int. Cl.[7] .......................... G01R 19/00; H01F 27/24

(52) U.S. Cl. ....................... 324/127; 336/212; 336/229; 324/126

(58) Field of Search ............................. 324/76.11, 126, 324/127; 336/229, 212, 178

(56) References Cited

U.S. PATENT DOCUMENTS 4,048,605 A * 9/1977 McCollum .................. 336/176
4,263,549 A 4/1981 Toppeto ...................... 324/127
4,309,655 A 1/1982 Lienhard et al. ............ 324/117
4,378,525 A 3/1983 Burdick ...................... 324/127
4,390,813 A 6/1983 Stanley ...................... 315/248
4,559,496 A 12/1985 Harnden, Jr. et al. ....... 324/127
4,707,619 A 11/1987 Chu et al. ................... 307/106
4,851,803 A * 7/1989 Hahn ......................... 336/176
5,426,360 A * 6/1995 Maraio et al. .............. 324/126
5,793,196 A 8/1998 White ........................ 324/127
6,426,632 B1 7/2002 Clunn ........................ 324/509

* cited by examiner

*Primary Examiner*—Anh Mai
(74) *Attorney, Agent, or Firm*—Ware, Fressola, Van Der Sluys & Adolphson LLP

(57) ABSTRACT

A current transformer to be installed around a current-carrying conductor. The transformer has a split core with two parts, which can be opened to allow the transformer to be installed around or removed from the current-carrying conductor. A winding wound on the core is operatively connected to a switch so that the winding can be shorted prior to opening the split core when the transformer is removed from the current-carrying conductor in order to reduce the magnetic force holding the split core parts together. The winding is shorted by the switch prior to closing the split core parts when the transformer is installed around the conductor in order to minimize the damage to the core due to the induced magnetic force thereon. A mechanical tool is used to open or close the split-core parts. The switch can be linked to the tool for shorting and opening the winding.

17 Claims, 7 Drawing Sheets

METHOD AND DEVICE FOR INSTALLING AND REMOVING A CURRENT TRANSFORMER ON AND FROM A CURRENT-CARRYING POWER LINE

This application claims the benefit of U.S. Provisional Application(s) No(s).: application Ser. No. 60/383,833 filing date May 28, 2002

FIELD OF THE INVENTION

The present invention relates to broadband communications using a power line as a transmission medium and, more particularly, a current transformer installed on a power line for obtaining power from the power line.

BACKGROUND OF THE INVENTION

In power-line communications (PLC), utility power lines, especially the high-voltage (HV, 60 kVAC and up) and medium-voltage (MV, 4–35 kVAC) power lines, are used as a transmission medium. The MV power lines are generally used to power the primaries of distribution transformers feeding electric power to homes and businesses. It is advantageous to convey communication signals in radio frequencies (RF).

A typical scenario in PLC is shown in FIG. 1. As shown, a main power line L1 and a number of other power lines L2, L3, L4 branching off from L1 are used to carry the RF communication signals. A server 10 is used at a distribution center to receive multimedia information from service providers and to send the information to a plurality of customers downstream. The server 10 uses an RF coupler 12 and an associated distribution modem 11 to broadcast the RF communication signals on power line L1 so that customers can receive the signals using their customer premise equipment (CPE). For example, CPE 20 and CPE 30 acquire the RF signals from L1 via RF couplers 22, 32 and associated modems 21, 31, while CPE 40 acquires the RF signals from L3 via an RF coupler 42 and an associated modem 41, and so on. On the upstream direction, customers can use their CPE to send request data to the server via the same couplers and modems.

It is known that RF signals are attenuated considerably as they are transmitted along the power line. As a result, a CPE located too far from the server 10 may not be able to receive usable RF signals. For example, while CPE 20 may be able to receive good signals from the server 10, CPEs 30, 40 and 50 may not. Thus, it is necessary to provide a plurality of repeaters 72, 74, etc. along the power lines to make it possible for CPE 30, 40 and 50 to receive the communication signals.

It should be noted that although a connection is shown from, for instance, server 10 to distribution modem 11, this connection may be via a wireless radio frequency link, e.g., according to IEEE specification 802.11x (where x=a, b, c, . . . , etc) or via a fiber optic link, etc. Such connections and methods can also be used from each of the CPEs 20, 30, 40, 50, etc. and their corresponding modems 21, 31, 41, 51, etc.

Similarly the connection from distribution modem 11 and RF coupler 12 and from each modem 21, 31, 41, 51, etc. to corresponding RF couplers 22, 32, 42, 52, etc. can be electrical (voltaic), optical or wireless.

In general, it is desirable that any server or CPE not have any physical connection (voltaic or optical fiber) to its corresponding modem if the corresponding modem is voltaically connected to its corresponding RF coupler. This general design goal is to eliminate any possible failure mode where MV voltages can be brought in contact with CPEs or servers.

When a repeater receives communication signals conveyed from the upstream direction via a power line, it is designed to repeat the communication signals so that the CPE in the downstream can receive useful RF signals. These repeated signals will also travel upstream along the same power line. When there are many repeaters along the same power line repeating the same communication signals, there will be significant interference among the repeated signals because of the delay in each repeater and the overlap of signals. In general, a repeater is needed at a location when the communication signals have been attenuated significantly but are still useful.

In power-line communications (PLC) as mentioned above, a current transformer operating at the utility frequency (50 or 60 Hz) can be used to obtain an induced current for powering the RF couplers 12, 22, 32, 42, 52 and the repeaters 72, 74, 76, for example. The same current transformer can also be used to power power-line current measurement equipment. If the current transformer is installed on an already operating power line, the current transformer must use a split core to develop power by magnetic induction.

The split core in a current transformer comprises at least two magnetically permeable parts, each shaped like a half donut, for example. When the current transformer is installed on an active, current-carrying power line, the split core parts must be closed around the power line to form a substantially closed-loop transformer core. Before the split core parts are completely closed, there will be a gap between the core parts. Because the current in the active power line creates a spatially nonlinear magnetic field near the surface of the conductor carrying the current, the magnetically permeable material of the split core parts will experience forces exerted by the nonlinear magnetic field. These forces are concentrated in the core gap in the open split core parts, and their magnitude is inversely proportional to the fourth power of the distance of the core gap. As the split core parts are closed onto each other to form a substantially closed-loop, the forces increase very rapidly and they may cause the split core to slam together. The slamming action can cause damage to the current transformer.

When the current transformer is removed from the active power line, it is necessary to create a gap in the split core parts. The same nonlinear magnetic field will exert an attractive force on the gap, preventing the gap from being widened. As a result, the counter-force required to open the split core in order to remove the current transformer from the active line may be larger than practical. Furthermore, once a gap is formed and it exceeds a certain distance, the reduction in the attractive force is significant and sudden, resulting in possible damage to the core if the split core parts are separated too rapidly.

Thus, it is advantageous and desirable to provide a method and device for reducing or eliminating the magnetic forces developed on the split core parts prior to the split core parts being closed to form a closed-loop in order to avoid damage to the split core parts. The same method and device can be used to reduce the counter-force necessary for opening the split core parts for removal.

SUMMARY OF THE INVENTION

It is a primary objective of the invention to reduce or eliminate the magnetic forces exerted on the split core parts of a current transformer when the current transformer is installed on an active, current-carrying power line and when the split core parts are opened for the removal of the current transformer from the power line. This objective can be achieved by shorting the multiple-turn winding on the split core parts during the installation and removal of the current transformer.

Thus, according to a first aspect of the present invention, there is provided a method of reducing magnetic forces exerted on a current transformer positioned about a current-carrying conductor, wherein the current transformer comprises a magnetically permeable core having at least two split core parts separable by a gap, and wherein the gap can be closed so as to allow the split core parts to form a substantially closed-loop around the current carrying conductor in a closed configuration, and the gap can be widened so as to allow the current transformer to be removed from the current-carrying conductor, and wherein the current transformer further comprises a winding having a plurality of turns of an electrical conductor wound around the magnetically permeable core. The method comprises the steps of shorting the winding prior to closing the gap between the split core parts for achieving the closed configuration, and shorting the winding prior to separating the split core parts from each other if the split core parts are in the closed configuration.

According to a second aspect of the present invention, there is provided a device for reducing magnetic forces exerted on a current transformer positioned about a current-carrying conductor, wherein the current transformer comprises a magnetically permeable core having at least two split core parts separated by a gap, and wherein the gap can be closed so as to allow the split core parts to form a substantially closed-loop around the current-carrying conductor in a closed configuration, and the gap can be widened so as to allow the current transformer to be removed from the current-carrying conductor, and wherein the current transformer further comprises a winding having a plurality of turns of an electrical conductor wound around the magnetically permeable core. The device comprises a mechanism capable of a shorting device in operative engagement with the winding so as to be able to short the winding; and a mechanism, positioned relative to the split core parts so as to be able to close the gap between the split core parts or to separate the split core parts from each other.

According to the third aspect of the present invention, there is provided a current transformer to be positioned about a current-carrying conductor. The current transformer comprises:

a magnetically permeable core having at least two split core parts separable by a gap, wherein the gap can be closed so as to allow the split core parts to form a substantially closed-loop around the current-carrying conductor in a closed configuration, and the gap can be widened for separating the split core parts from each other so as to allow the current transformer to be removed from around the current-carrying conductor;

a winding having a plurality of turns of an electrical conductor wound around the magnetically permeable core; and a shorting device positioned relative to the winding so as to be able to:

short the winding prior to closing the gap, and to be able to short the winding prior to separating the split core parts if the split core parts are in the closed configuration.

BEST MODE TO CARRY OUT THE INVENTION

Figure 1:
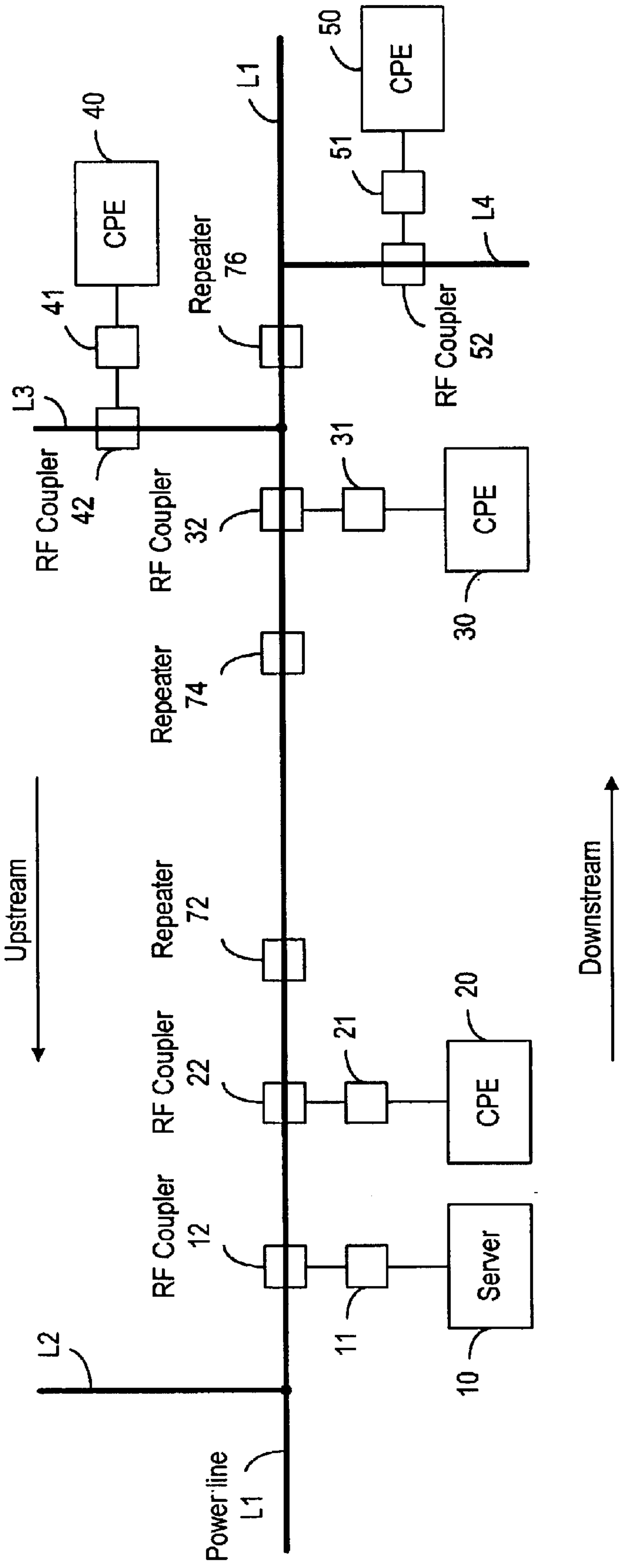
FIG. 1 is a schematic representation showing a power line communications network.
Figure 2:
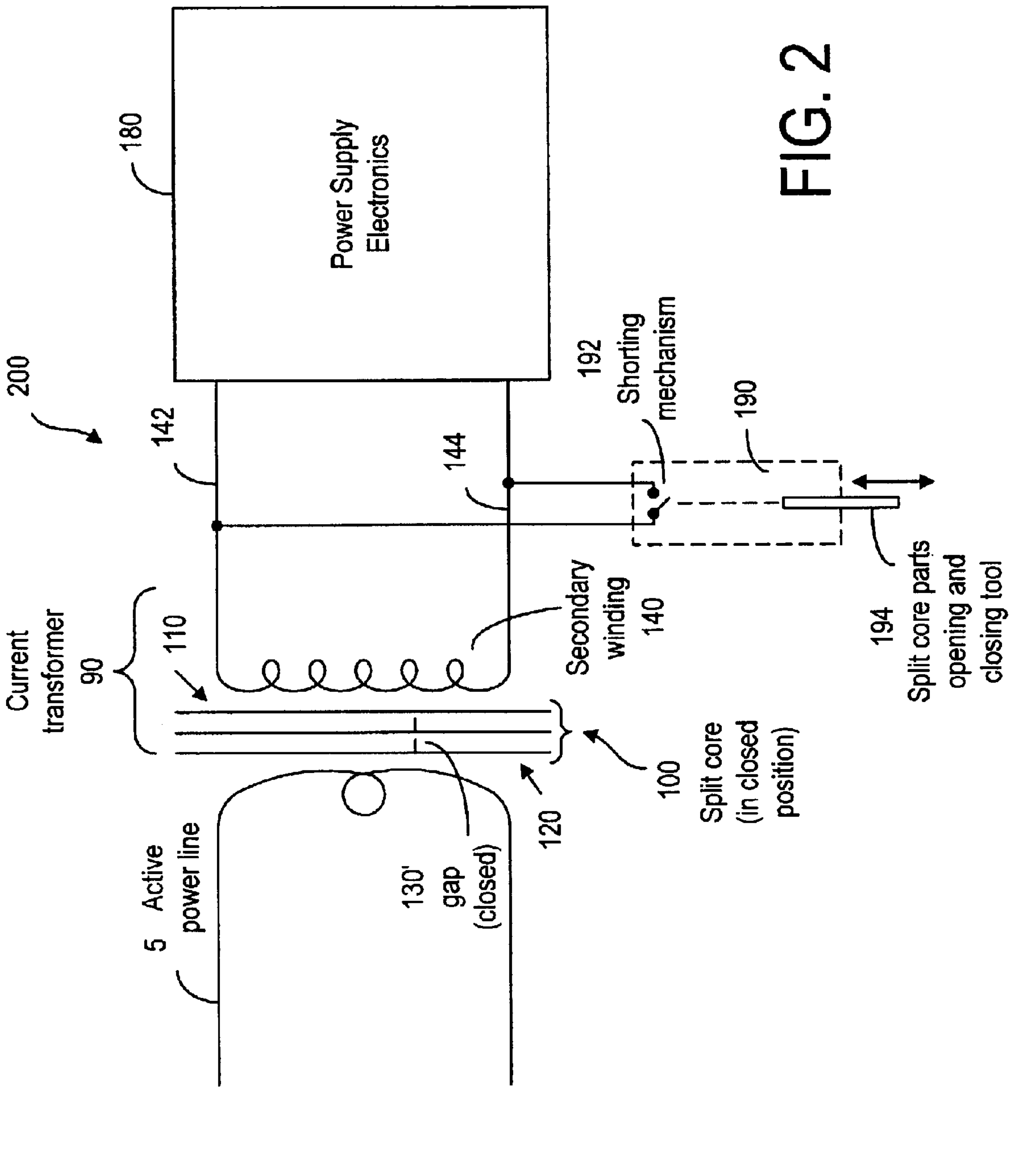
FIG. 2 is a schematic representation showing a current transformer and a device for shorting the winding of the current transformer, according to the present invention.

The current transformer 90, as shown in FIG. 2, has a secondary winding 140 of Ns turns around a split core 100. When the winding is shorted, a current with a magnitude substantially equal to Ip/Ns is developed in the shorted winding through normal transformer action, where Ip is the current in the conductor 5. This current creates an opposing magnetic field in the core, canceling the spatially nonlinear magnetic field generated near the surface of the active power line 5 due to the current flow in the conductor. The magnetic field created by the shorted winding greatly minimizes the forces on the core caused by this spatially nonlinear magnetic field. The shorting of the winding both protects the split core parts 110, 120 when they are closed to form a substantially closed-loop and allows the opening of the split core parts with minimal force.

Preferably, the current transformer 90 is placed in a housing 200, which may comprise a power supply 180 of which the current transformer is a part. In order to install the current transformer 90 on a power line 5 or to remove the current transformer 90 from the power line 5, it is preferable to use a tool 194 to cause the split core parts 110, 120 to close or to open. This tool 194 can also be used to short the secondary winding by closing a switch or shorting mechanism 192. The tool 194 and the switching mechanism 192 are disposed in a control assembly 190.

As shown in FIG. 2, the two ends 142, 144 of the secondary winding 140 are connected to the shorting mechanism 192. The shorting mechanism 192 is operatively connected to the tool 194 that is used to cause the split core parts 110, 120 to close or to open. During the installation of the current transformer 90, the tool 194 causes the shorting mechanism 192 to close, thereby electrically connecting the ends 142, 144, and shorting the secondary winding 140 prior to closing the split core parts 110, 120 to form a substantially closed-loop around the conductor 5. After the installation is completed, the tool 194 can be disengaged from the core

100, keeping the split core parts 110, 120 in the "closed" position. At the same time, the tool 194 causes the shorting mechanism 194 to open, thereby allowing the secondary winding 140 to obtain the induced current through a transformer action. Preferably, the tool 194 is removed from the control assembly 190 and the housing 200 after the installation of the current transformer 90 is completed.

During the removal of the current transformer 90 from the power line 5, the tool 194 is applied to the control assembly 190 of the housing 200. The tool 194 causes the shorting mechanism 192 to close, thereby shorting the secondary winding 140. Subsequently, the tool 194 causes the split core parts 110, 120 to separate, allowing the current transformer 90 to be removed from the conductor 5.

It should be noted that the winding 140, when it is not shorted, is also used for generating the current conveyed to the power supply electronics 180, as shown in FIG. 2. When the winding 140 is not shorted, the winding 140 is "opened". The term "opened" simply means that the two ends 142, 144 are not electrically connected with each other. In this context, the winding 140 can be used for obtaining induced current when the winding is "opened". However, it is also possible to use two separate windings 140, 150 around the split core 100, as shown in FIG. 3.

Figure 3:
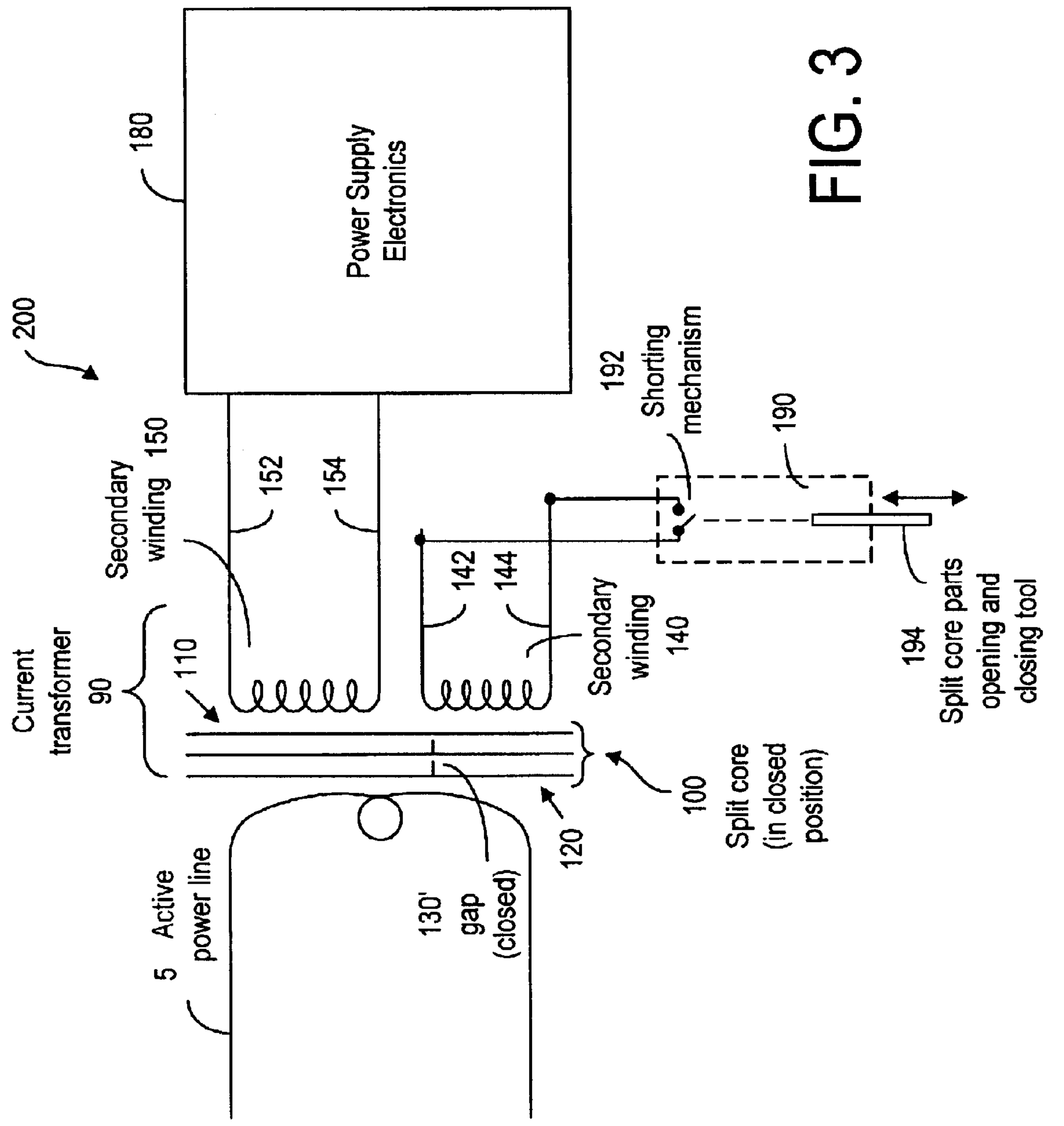
FIG. 3 is a schematic representation showing another embodiment of the current transformer.

As shown in FIG. 3, the further secondary winding 150 is used for generating the current conveyed to the power supply electronics 180, while the secondary winding 140 is used for generating the opposing magnetic field in the core to cancel the spatially nonlinear magnetic field near the surface of the conductor. The two ends 152, 154 of the further secondary winding 150 are connected to the power supply electronics 180. The two ends 142, 144 of the secondary winding 140 are connected to the shorting mechanism 192. As with the embodiment shown in FIG. 2, the shorting mechanism 192 is operatively connected to the tool 194 that is used to cause the split core parts 110, 120 to close or to open. During the installation of the current transformer 90, the tool 194 causes the shorting mechanism 192 to close, thereby electrically connecting the ends 142, 144, and shorting the secondary winding 140 prior to closing the split core parts 110, 120 to form a substantially closed-loop around the conductor 5. The normally induced current of Ip/Ns in the further secondary winding 150 will be nearly zero because of the presence of the now shorted winding 140. This is true because the shorting mechanism 192 on the secondary winding 140 causes the voltage on the further secondary winding 150 through normal transformer action to be very low. The load presented by the power supply electronics 180 is nonlinear in nature and will not accept current with a low voltage at the further secondary winding 150.

If the secondary winding 140 also has Nt turns around the split core 100, an induced current Ip/Nt in the secondary winding 140 creates an opposing magnetic field in the core, canceling the spatially nonlinear magnetic field generated near the surface of the active power line 5. It should be noted that the number of turns Ns on the further secondary winding 150 are chosen to satisfy the requirements of the power supply electronics 180, while the number of turns Nt on the secondary winding 140 are chosen for the requirements of the shorting mechanism 192. Thus, Nt can be chosen independently of Ns. However, Nt should be chosen so that neither the current Ip/Nt nor the voltage on the shorting mechanism 192, when it is opened, is too high.

After the installation is completed, the tool 194 can be disengaged from the core 100, keeping the split core parts 110, 120 in the "closed" position. At the same time, the tool 194 causes the shorting mechanism 192 to open, thereby allowing the secondary winding 140 to obtain the induced current through a transformer action. Preferably, the tool 194 is removed from the control assembly 190 and the housing 200 after the installation of the current transformer 90 is completed. During the removal of the current transformer 90 from the power line 5, the tool 194 is applied to the control assembly 190 of the housing 200. The tool 194 causes the shorting mechanism 192 to close, thereby shorting the secondary winding 140. Subsequently, the tool 194 causes the split core parts 110, 120 to separate, allowing the current transformer 90 to be removed from the conductor 5.

Figure 4B:
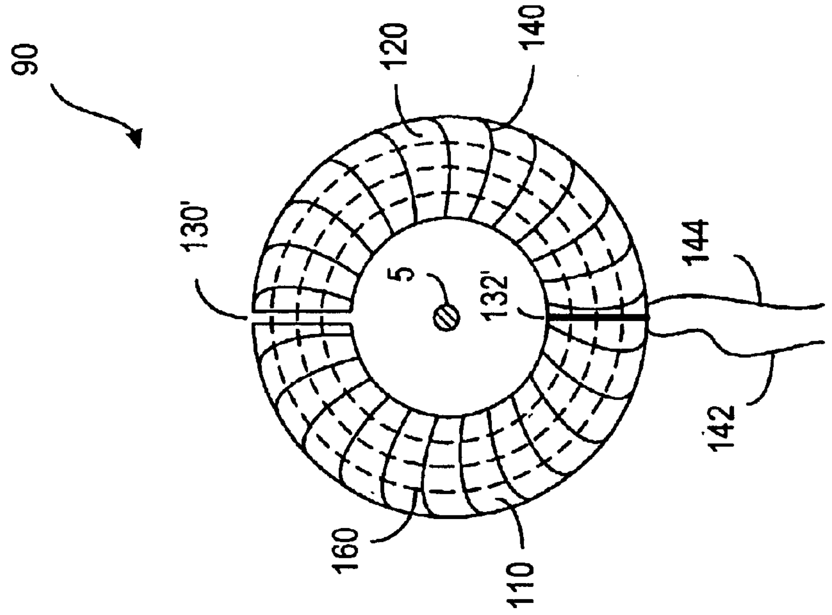
FIG. 4*b* is a schematic representation showing the split core of FIG. 4*a* in a closed position.
Figure 4A:
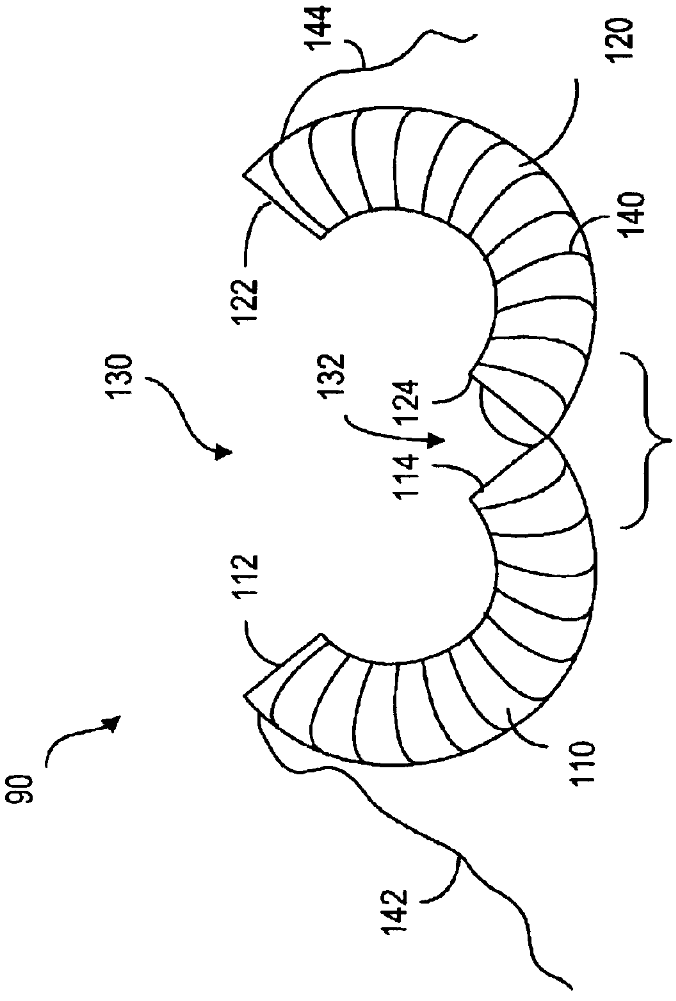
FIG. 4*a* is a schematic representation showing a split core for use in a current transformer of FIG. 2, wherein the split core is in an open position.

FIG. 4*a* is a schematic representation showing the split core 100 of the current transformer 90 of FIG. 2. As shown, the winding 140 is partially wound on the first split core part 110 and partially on the second split core part 120. The first split core part 110 has a first end 112 and a second end 114. The second split core part 120 has a first end 122 and a second end 124. When the split core 100 is in an open position, the first end 112 of the first split core part 110 and the first end 122 of the second split core part 120 form a gap 130. Likewise, the second end 114 of the first split core part 110 and the second end 124 of the second split core part 120 form a gap 132. When the first split core part 110 and the second split core part 120 are put together around the power line 5 to form a substantially closed loop transformer core, as shown in FIG. 4*b*, the spatially nonlinear magnetic field near the surface of the conductor 5 will exert a force on the first and second core parts 110 and 120. This force increases rapidly as the gaps 130 and 132 are reduced.

As described in conjunction in FIG. 2, the force can be reduced or eliminated by shorting the ends 142, 144 of the secondary winding 140. After installation is completed and the split core parts 110, 120 is in the "closed" position, the shorting between the ends 142, 144 is removed, as shown in FIG. 4*b*. As shown, when the ends 142 and 144 are not shorted, the magnetic flux 160 in the split core 100 causes the winding 140 to induce a current, which is conveyed to the power supply electronics 180 (FIG. 2). It should be noted that the gaps 130 and 132 may not be completely closed when the split core 100 is in the "closed" position. An air gap 130' could exist between the first end 112 of the first split core part 110 and the first end 122 of the second split core part 120. Likewise, an air gap 132' could exist between the second end 114 of the first split core part 110 and the second end 124 of the second split core part 120. Preferably, the first end 142 and the second end 144 of the winding 140 are brought near the second ends 114 and 124 of the split core parts 110 and 120.

Figure 4D:
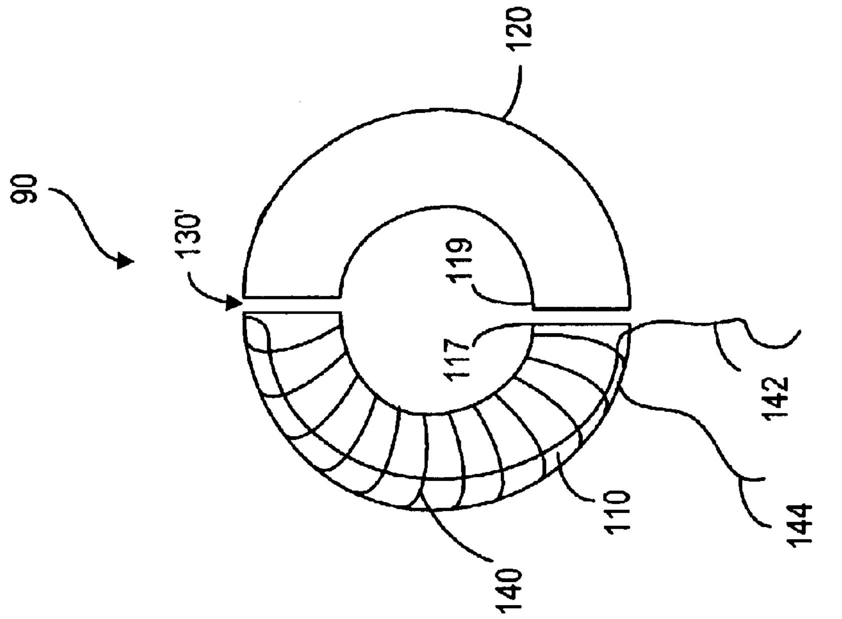
FIG. 4*d* is a schematic representation showing the split core of FIG. 4*c* in a closed position.
Figure 4C:
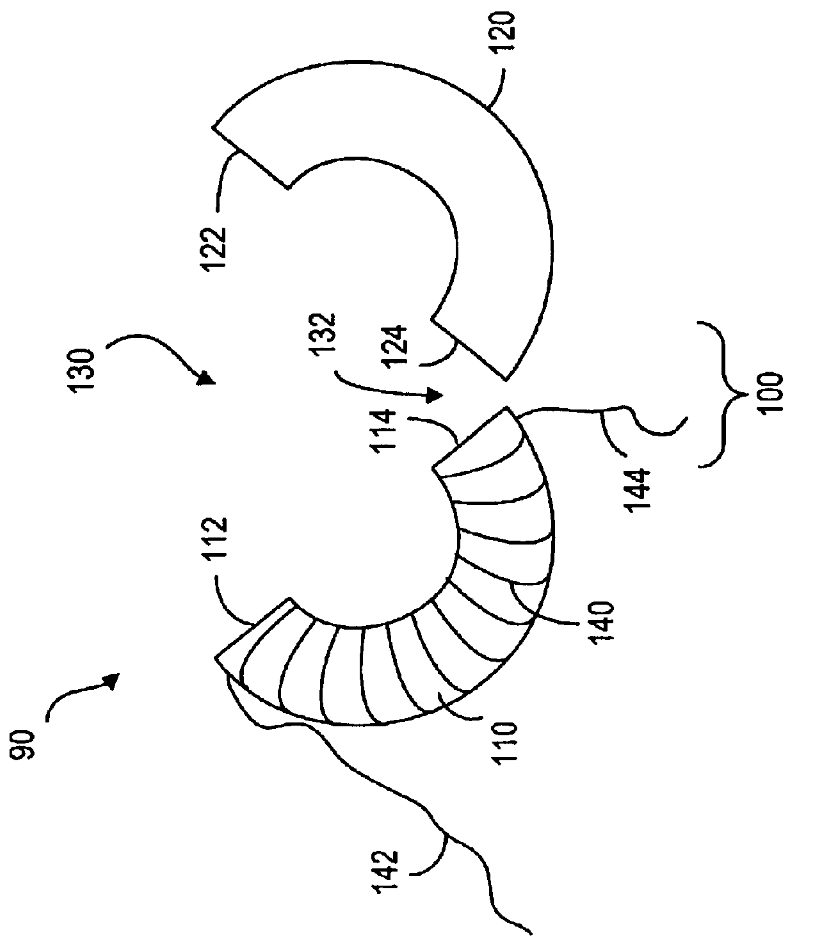
FIG. 4*c* is a schematic representation showing another embodiment of the split core, according to the present invention, wherein the split core is in an open position.
Figure 6:
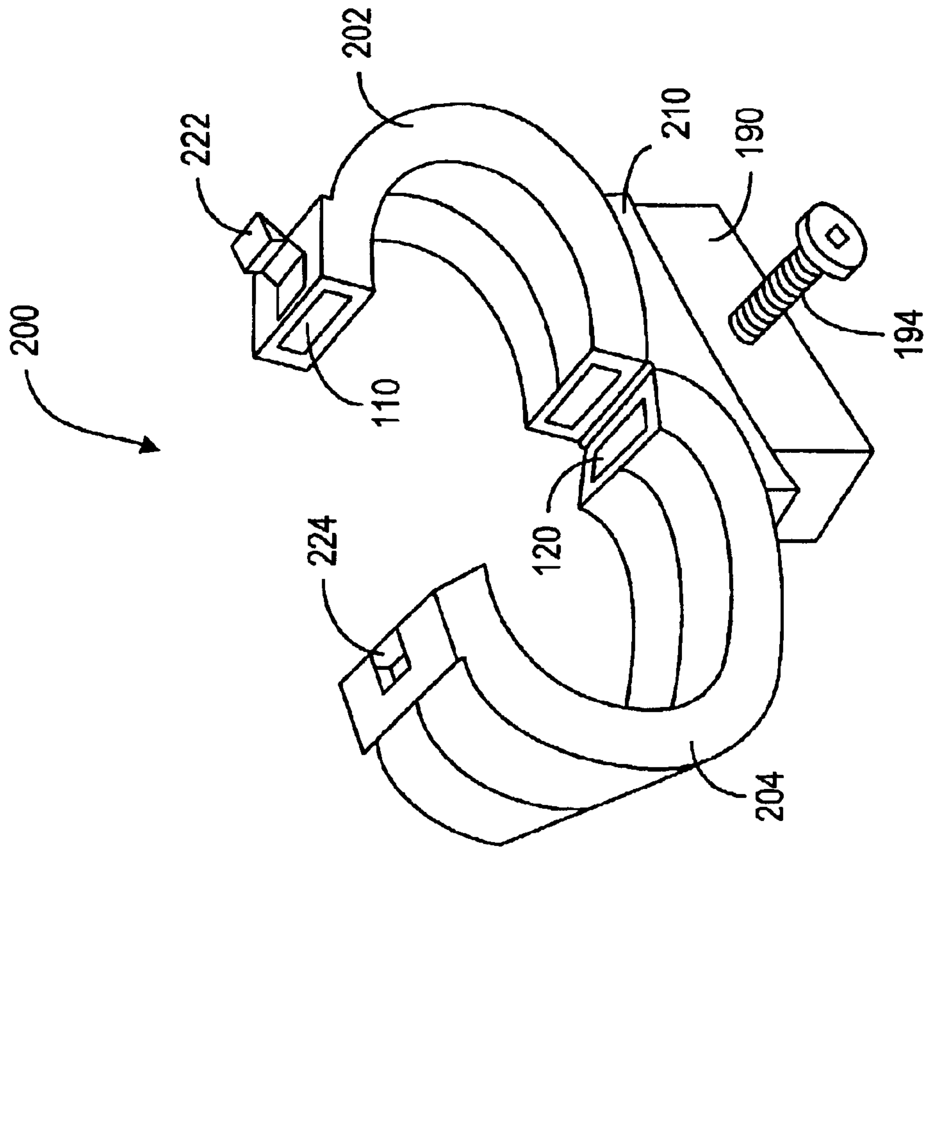
FIG. 6 is a schematic representation showing a housing of the split core.

The winding 140, as shown in FIGS. 4*a* and 4*b*, is wound on both split core parts 110 and 120. In practice, because both parts must be separately installed in a housing, such as the housing 200 shown in FIG. 6, the linkage between the core parts 110 and 120 may not be desirable. Thus, it is preferable to have the winding 140 wound only on one of the split core parts. As shown in FIGS. 4*c* and 4*d*, the secondary winding 140 is wound only on the split core part 110.

Figure 5B:
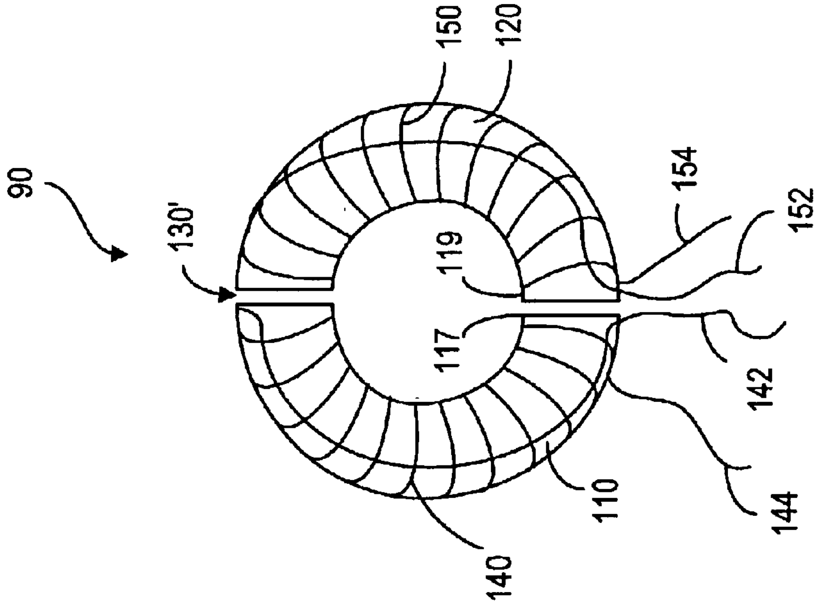
FIG. 5*b* is a schematic representation showing the split core of FIG. 5*a* in a closed position.
Figure 5A:
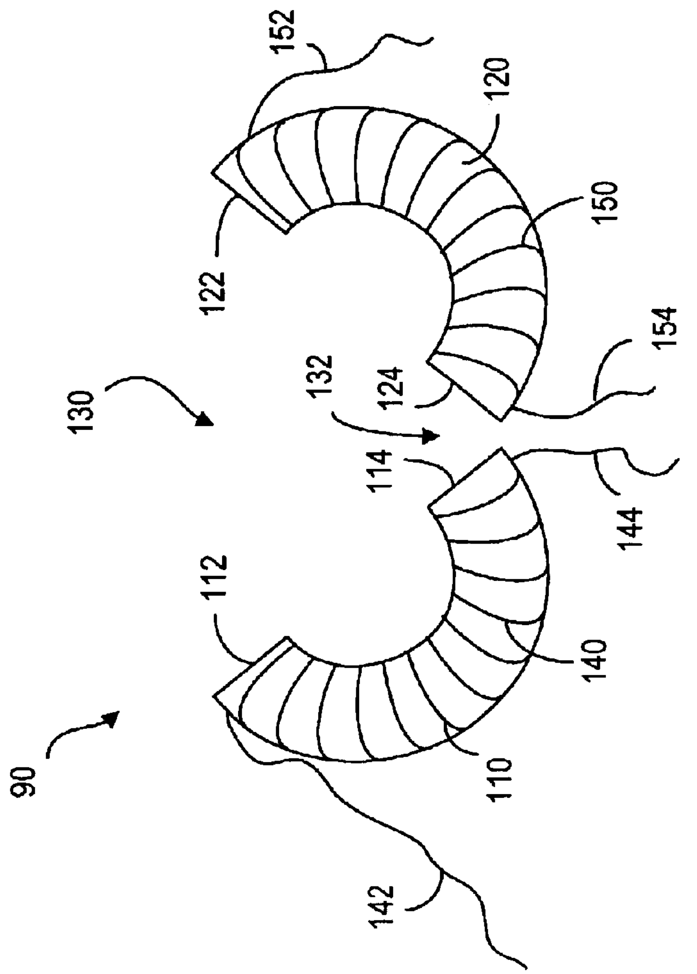
FIG. 5*a* is a schematic representation showing a split core for use in a current transformer of FIG. 3, wherein the split core is in an open position.

FIG. 5*b* is a schematic representation showing the split core 100 of the current transformer 90 of FIG. 3. Advantageously, the secondary winding 140 is wound on the first split core part 110, and the further secondary winding 150 is wound on the second split core part 120. When the first split core part 110 and the second split core part 120 are put together around the power line 5 to form a substantially closed loop transformer core, as shown in FIG. 5*b*, the spatially nonlinear magnetic field near the surface of the conductor 5 will exert a force on the first and second core parts 110 and 120. This force increases rapidly as the gaps 130 and 132 are reduced. As described in conjunction in FIG. 3, the force can be reduced or eliminated by shorting the ends 142, 144 of the secondary winding 140. In this embodiment, the winding ends 152 and 154 of the further secondary winding 150 are not affected by the opening or closing of the split core parts 110, 120. After installation is completed and the split core parts 110, 120 are in the "closed" position, the shorting between the ends 142, 144 is removed, as shown in FIG. 5*b*.

In order to facilitate the opening and closing of the split core 100, the split core parts 110 and 120 are separately disposed in the first half 202 and the second half 204 of the housing 200. The housing 200 has a hinge 210 to keep the two halves 202 and 204 together so that the split core 100 can be operated in the open or closed position as shown in FIGS. 4*a* to 5*b*. The housing 200 also has a latching mechanism to keep the two halves 202, 204 in a locked position when the split core 100 is operated in the closed position. The latching mechanism comprises a hook 222 on the first half 202 to be engaged with a counterpart 224 of the second part 204, for example. As shown, the hinge 210 is mechanically engaged with the control assembly 190 so as to allow the mechanical tool 194 to cause the split core parts 110, 120 to open or to close.

Although the invention has been described with respect to a preferred embodiment thereof, it will be understood by those skilled in the art that the foregoing and various other changes, omissions and deviations in the form and detail thereof may be made without departing from the scope of this invention.

What is claimed is:

1. A method of reducing magnetic forces exerted on a current transformer (90) positioned about a current-carrying conductor (5), wherein the current transformer (90) comprises a magnetically permeable core (100) having at least two split core parts (110, 120) separable by a gap (130), and wherein the gap can be closed so as to allow the split core parts to form a substantially closed-loop around the current-carrying conductor in a closed configuration, and the gap can be widened so as to allow the current transformer to be removed from the current-carrying conductor, and wherein the current transformer further comprises a winding (140) having a plurality of turns of an electrical conductor wound around the magnetically permeable core, said method comprising the steps of:

shorting the winding prior to closing the gap between the split core parts for achieving the closed configuration; and shorting the winding prior to separating the split core parts from each other if the split core parts are in the closed configuration.

2. The method of claim 1, further comprising the step of opening the winding after the split core parts are in the closed configuration.

3. The method of claim 2, further comprising the step of opening the winding after the split core parts are separated from each other.

4. The method of claim 1, further comprising the step of opening the winding after the split core parts are separated from each other.

5. A device for reducing magnetic forces exerted on a current transformer (90) positioned about a current-carrying conductor (5), wherein the current transformer comprises a magnetically permeable core (100) having at least two split core parts (110, 120) separable by a gap (130), and wherein the gap can be closed so as to allow the split core parts to form a substantially closed-loop around the current-carrying conductor in a closed configuration, and the gap can be widened so as to allow the current transformer to be removed from the current-carrying conductor, and wherein the current transformer further comprises a winding having a plurality of turns of an electrical conductor wound around the magnetically permeable core, said device comprising:

a shorting device (192) in operative engagement with the winding (140) so as to be able to short the winding; and a mechanism (194), positioned relative to the split core parts so as to be able to close the gap between the split core parts or to separate the split core parts from each other.

6. The device of claim 5, wherein the mechanism is operatively connected to the shorting device so as to cause the shorting device to short the winding prior to closing the gap, and to short the winding prior to separating the split core parts from each other if the split core parts are in the closed configuration.

7. The device of claim 6, wherein the mechanism (194) is adapted to cause the shorting device to open the winding after the gap is closed.

8. The device of claim 7, wherein the mechanism (194) is adapted to cause the shorting device to open the winding after the split core parts are separated from each other.

9. The device of claim 6, wherein the mechanism (194) is adapted to cause the shorting device to open the winding after the split core parts are separated from each other.

10. A current transformer (90) to be positioned about a current-carrying conductor (5), comprising:

a magnetically permeable core (100) having at least two split core parts (110, 120) separable by a gap (130), wherein the gap can be closed so as to allow the split core parts to form a substantially closed-loop around the current-carrying conductor in a closed configuration, and the gap can be widened for separating the split core parts from each other so as to allow the current transformer to be removed from around the current-carrying conductor;

a winding (140) having a plurality of turns of an electrical conductor wound around the magnetically permeable core; and a shorting device (192) positioned relative to the winding so as to be able to:

short the winding prior to closing the gap, and to be able to short the winding prior to separating the split core parts if the split core parts are in the closed configuration.

11. The current transformer of claim 10, further comprising a mechanism (194), positioned relative to the split core parts so as to be able to close the gap between the split core parts or to separate the split core parts from each other.

12. The current transformer of claim 11, wherein the mechanism is operatively connected to the shorting device so as to cause the shorting device to short the winding.

13. The current transformer of claim 12, wherein the mechanism is adapted to cause the shorting device to open the winding after the gap is closed.

14. The current transformer of claim 12, wherein the mechanism is adapted to cause the shorting device to opening the winding after the split core parts are separated from each other.

15. The current transformer of claim 10, wherein the shorting device is able to open the winding after the gap is closed.

16. The current transformer of claim 10, wherein the shorting device is able to open the winding after the split core parts are separated from each other.

17. The current transformer of claim 10, further comprising another winding (150) wound around the magnetic permeable core for obtaining an induced current when the split core parts are in the closed configuration.

* * * * *